United States Patent
Gotoh et al.

(10) Patent No.: US 7,009,205 B2
(45) Date of Patent: Mar. 7, 2006

(54) IMAGE DISPLAY DEVICE USING TRANSISTORS EACH HAVING A POLYCRYSTALLINE SEMICONDUCTOR LAYER

(75) Inventors: Jun Gotoh, Mobara (JP); Katsutoshi Saito, Mobara (JP); Makoto Ohkura, Fuchu (JP); Yukio Takasaki, Kawasaki (JP); Masanao Yamamoto, Mobara (JP)

(73) Assignees: Hitachi, Ltd., Tokyo (JP); Hitachi Device Engineering Co., Ltd., Chiba-Ken (JP)

( * ) Notice: Subject to any disclaimer, the term of this patent is extended or adjusted under 35 U.S.C. 154(b) by 0 days.

(21) Appl. No.: 10/337,370

(22) Filed: Jan. 7, 2003

(65) Prior Publication Data

US 2003/0164489 A1 Sep. 4, 2003

(30) Foreign Application Priority Data

Jan. 15, 2002 (JP) .............................. 2002-005845

(51) Int. Cl.
*H01L 29/04* (2006.01)

(52) U.S. Cl. .......................... 257/72; 257/61; 257/401; 257/406; 438/162

(58) Field of Classification Search ............ 257/48–49, 257/72, 350, 401–402; 438/162–163, 166, 438/151–154, 482–486
See application file for complete search history.

(56) References Cited

U.S. PATENT DOCUMENTS

2002/0005517 A1 *  1/2002  Inoue .......................... 257/66
2003/0013280 A1 *  1/2003  Yamanaka ................... 438/487
2003/0077886 A1 *  4/2003  Machida et al. ............ 438/535

* cited by examiner

*Primary Examiner*—Dung A. Le
(74) *Attorney, Agent, or Firm*—Reed Smith LLP; Stanley P. Fischer, Esq.; Juan Carlos A. Marquez, Esq.

(57) ABSTRACT

An image display device using transistors each having a polycrystalline semiconductor layer constructed so that drain and source regions are fully activated, and a manufacturing method thereof. The polycrystalline semiconductor layer is so provided that impurity concentrations are easy to control in LDD regions. The image display device further uses transistors having a gate electrode on an upper surface of the semiconductor layer with an insulating film therebetween, a drain region formed on one side of the gate electrode, and a source region formed on another side of the gate electrode. An activated P-type impurity is added to the area underlying the gate electrode, and an activated N-type impurity is added to the area excluding the area underlying the gate electrode.

6 Claims, 3 Drawing Sheets

IMAGE DISPLAY DEVICE USING TRANSISTORS EACH HAVING A POLYCRYSTALLINE SEMICONDUCTOR LAYER

BACKGROUND OF THE INVENTION

The present invention relates to an image display device using transistors each having a polycrystalline semiconductor layer, as well as to a manufacturing method of such image display device.

For example, a liquid crystal display device includes pixel areas each made of an area surrounded by a pair of gate signal lines and a pair of drain signal lines on a liquid-crystal-side surface of one of substrates disposed in opposition to each other with a liquid crystal interposed therebetween, and each of the pixel areas is provided with a thin film transistor and a pixel electrode. The thin film transistor is operated by a scanning signal from one of the pair of gate signal lines, and the pixel electrode is supplied with a video signal from one of the pair of drain signal lines via this thin film transistor.

As such thin film transistor, a thin film transistor having a semiconductor layer using, for example, a polycrystalline Si (poly-Si) is known.

The semiconductor layer is formed by forming a layer made of amorphous Si (a-Si) on a substrate surface and polycrystallizing the layer by, for example, irradiation with laser light.

The thin film transistor is also formed by adding, for example, boron (B) to the polycrystallized semiconductor layer to make it P-type, forming an oxide film on a surface of the P-type semiconductor layer, forming a gate electrode on the upper surface of this oxide film in such a manner that the gate electrode intersects the semiconductor layer, and adding, for example, phosphorus (P) by using the gate electrode as a mask, to make the semiconductor layer N-type on the opposite sides of an area immediately below the gate electrode, i.e., in a drain region and a source region.

Incidentally, during the formation of the drain region and the source region, it is general practice to add phosphorus (P) with a mask (photoresist) withdrawn and form a so-called LDD region (Lightly Doped Drain) as an N-type region at the boundary between each of the drain region and the source region and the area immediately below the gate electrode.

BRIEF SUMMARY OF THE INVENTION

However, the polycrystalline thin film transistor constructed in this manner has the problem that the activation of phosphorus which is an N-type impurity in the semiconductor layer is extremely difficult.

Accordingly, the polycrystalline thin film transistor also has the problem that the control of impurity concentration in the LDD region is extremely difficult.

The invention aims to provide an image display device of superior display characteristics which has polycrystalline thin film transistors each having fully activated drain and source regions, as well as a manufacturing method of such image display device.

The invention also aims to provide an image display device whose manufacturing yield is good because of its construction which makes impurity concentrations easy to control in the LDD regions of each polycrystalline thin film transistor, as well as a manufacturing method of such image display device.

Representative aspects of the invention disclosed in the present application will be described below in brief.

According to one aspect of the present application, an image display device using transistors each having a polycrystalline semiconductor layer according to the invention includes: a gate electrode formed on an upper surface of the polycrystalline semiconductor layer with an insulating film interposed therebetween, a drain region being formed in the polycrystalline semiconductor layer on one side of the gate electrode, and a source region being formed in the polycrystalline semiconductor layer on another side of the gate electrode; an activated P-type impurity added to the polycrystalline semiconductor layer in an area underlying (particularly, immediately below) the gate electrode; and an activated N-type impurity added to the polycrystalline semiconductor layer in an area excluding the area underlying (particularly, immediately below) the gate electrode.

According to this construction, the drain region and source region of each of the polycrystalline thin film transistors can be fully activated, whereby it is possible to provide an image display device of superior display characteristics.

This polycrystalline semiconductor layer has areas which respectively extend from the area underlying the gate electrode to the drain region and the source region and in which the activated P-type impurity is distributed to gradually decrease from the area underlying the gate electrode toward the drain region and the source region, respectively.

In addition, this polycrystalline semiconductor layer of the polycrystalline thin film transistor to which the activated N-type impurity is added is formed by doping an amorphous semiconductor with an N-type impurity and annealing the amorphous semiconductor by irradiation with laser light.

According to another aspect of the present application, an image display device using transistors each having a polycrystalline Si layer includes: a gate electrode formed on an upper surface of the polycrystalline Si layer with an insulating film interposed therebetween, a drain region being formed in the polycrystalline Si layer on one side of the gate electrode, and a source region being formed in the polycrystalline Si layer on another side of the gate electrode; activated boron added to the polycrystalline Si layer in an area underlying (particularly, immediately below) the gate electrode; and activated phosphorus added to the polycrystalline Si layer in an area excluding the area underlying (particularly, immediately below) the gate electrode. The polycrystalline Si layer has areas which respectively extend from the area underlying the gate electrode to the drain region and the source region and in which the activated boron is distributed to gradually decrease from the area underlying (particularly, immediately below) the gate electrode toward the drain region and the source region, respectively.

According to this construction, the drain region and source region of each of the polycrystalline Si transistors can be fully activated, whereby it is possible to provide an image display device of superior display characteristics.

In addition, the polycrystalline Si layer of each of the polycrystalline Si transistors is formed by doping an amorphous Si layer with phosphorus and annealing the amorphous Si layer by irradiation with laser light.

According to another aspect of the present application, a manufacturing method of an image display device includes: a step of adding an N-type impurity to an amorphous Si layer formed on an upper surface of a substrate; a step of forming an N-type polycrystalline Si layer by irradiating the amorphous Si layer with laser light; a step of forming an insulating film on an upper surface of the N-type polycrystalline Si layer; a step of selectively adding a P-type impurity to an area between a drain region and a source region of the N-type polycrystalline Si layer; and a step of forming a gate electrode on a part of the area to which the P-type impurity is added.

Accordingly, polycrystalline Si transistors each having fully activated drain and source regions can be manufactured, whereby it is possible to provide an image display device of superior display characteristics.

The manufacturing method further includes a step of activating the P-type impurity by heating the gate electrode.

The gate electrode is heated by RTA (Rapid Thermal Annealing) using, for example, a short-wavelength arc lamp.

According to another aspect of the present application, a manufacturing method of an image display device using transistors each having a polycrystalline Si layer includes: a step of adding phosphorus ions to an amorphous Si layer formed on an upper surface of a substrate; a step of forming an N-type polycrystalline Si layer by irradiating the amorphous Si layer with laser light; a step of forming an insulating film on an upper surface of the N-type polycrystalline Si layer; a step of selectively adding boron ions to an area between a drain region and a source region of the N-type polycrystalline Si layer; and a step of forming a gate electrode on a part of the area to which the boron ions are added.

The manufacturing method further includes a step of activating the P-type impurity by using a short-wavelength arc lamp.

DETAILED DESCRIPTION OF THE INVENTION

Embodiments of polycrystalline thin film transistors and a manufacturing method thereof according to the invention will be described below with reference to the accompanying drawings.

Embodiment 1

<<Entire Construction>>

Figure 2:
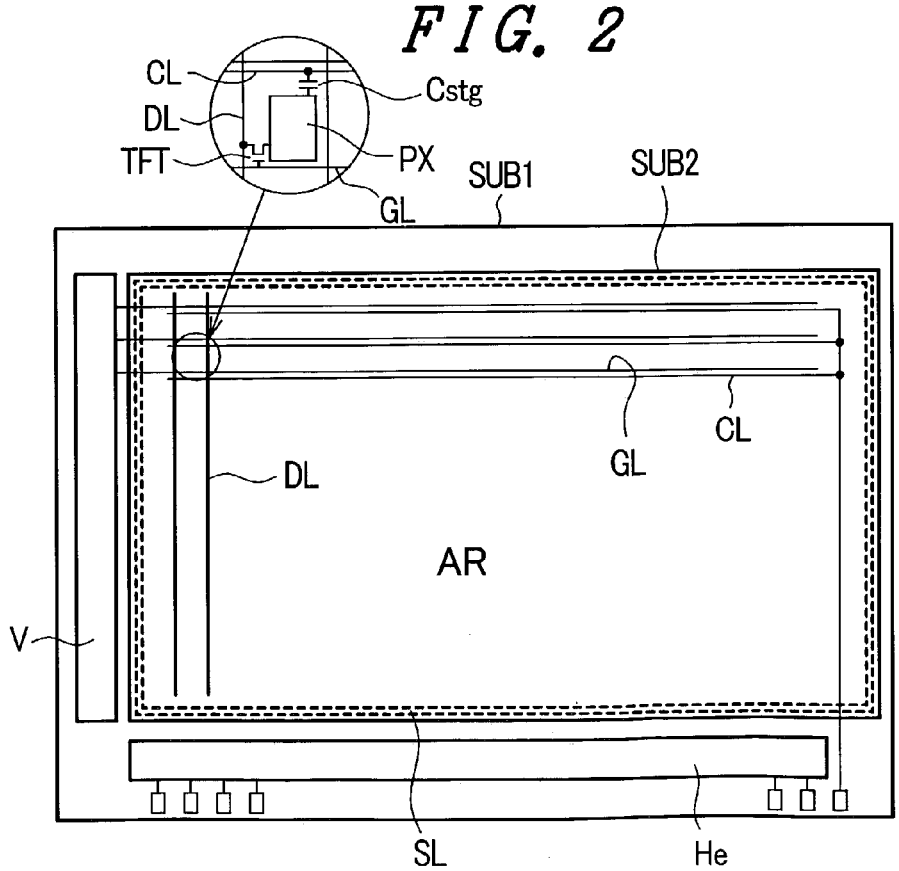
FIG. 2 is a construction view showing one embodiment of a liquid crystal display device in which thin film transistors according to the invention are formed.

FIG. 2 is a general construction view showing Embodiment 1 of a liquid crystal display device to which polycrystalline thin film transistors according to the invention are applied. FIG. 2 is an equivalent circuit diagram which is depicted to correspond to the actual geometrical arrangement of the liquid crystal display device.

In FIG. 2, there are shown a pair of transparent substrates SUB1 and SUB2 which are disposed in opposition to each other with a liquid crystal interposed therebetween. The liquid crystal is sealed by a sealing material SL which also serves to secure the transparent substrate SUB1 to the transparent substrate SUB2.

Gate signal lines GL and drain signal lines DL are formed in the area surrounded by the sealing material SL on a liquid-crystal-side surface of the transparent substrate SUB1. The gate signal lines GL are disposed to be extended in the x direction and to be juxtaposed in the y direction as viewed in FIG. 2, while the drain signal lines DL are disposed to be extended in the y direction and to be juxtaposed in the x direction as viewed in FIG. 2.

Areas each of which is surrounded by adjacent ones of the gate signal lines GL and adjacent ones of the drain signal lines DL constitute pixel areas, respectively, and a matrix-formed aggregation of these pixel areas constitutes a liquid crystal display part AR which is a display area.

Counter voltage signal lines CL each of which is common to pixel areas juxtaposed in each row in the x direction are formed to run through the pixel areas along the respective rows. Each of the counter voltage signal lines CL is connected to one of the electrodes of a capacitance element Cstg formed in each of the pixel areas, and a constant voltage is applied to each of the counter voltage signal lines CL.

A thin film transistor TFT and a pixel electrode PX are formed in each of the pixel areas. The thin film transistor TFT is operated by a scanning signal from one of the adjacent gate signal lines GL, and the pixel electrode PX is supplied with a video signal from one of the adjacent drain signal lines DL via this thin film transistor TFT. This pixel electrode PX is connected to the other of the electrodes of the capacitance element Cstg. This capacitance element Cstg is provided for the purposes of storing a video signal supplied to the pixel electrode PX for a comparatively long time.

The thin film transistor TFT has a semiconductor layer made of a polycrystalline material, for example, Si (p-Si).

The pixel electrode PX is arranged to generate an electric field between the pixel electrode PX and a counter electrode CT which is formed on a liquid-crystal-side surface of the transparent substrate SUB2 in common to the pixel areas juxtaposed along one of the rows, whereby the optical transmissivity of the liquid crystal is controlled by the electric field.

One end of each of the gate signal lines GL is formed to be extended beyond the sealing material SL, and the extended end is connected to a vertical scanning driver circuit V which is formed on the surface of the transparent substrate SUB1. This vertical scanning driver circuit V is formed of a multiplicity of MIS transistors and an interconnection layer which interconnects these MIS transistors.

Similarly, one end of each of the drain signal lines DL is formed to be extended beyond the sealing material SL, and the extended end is connected to a video signal driver circuit He which is formed on the surface of the transparent substrate SUB2. This video signal driver circuit He is also formed of a multiplicity of MIS transistors and an interconnection layer which interconnects these MIS transistors.

Each of the MIS transistors which constitute the vertical scanning driver circuit V and the video signal driver circuit He has a semiconductor layer formed of a polycrystalline layer similar to that of the thin film transistor TFT. For this reason, it is general practice to form the MIS transistors in parallel with the formation of the thin film transistors TFT.

The counter voltage signal lines CL each of which is common to the pixel areas juxtaposed in each row in the x direction are connected to a common connection line, for example, at their right-hand ends as viewed in FIG. 2. The connection line is formed to be extended beyond the sealing material SL, and constitutes a terminal CLT at its extended end.

Each one of the gate signal lines GL is sequentially selected by a scanning signal from the vertical scanning driver circuit V.

In addition, a video signal is supplied to each of the drain signal lines DL by the video signal driver circuit He in synchronism with the timing of selection of each one of the gate signal lines GL.

<<Construction of Pixel>>

Figure 3:
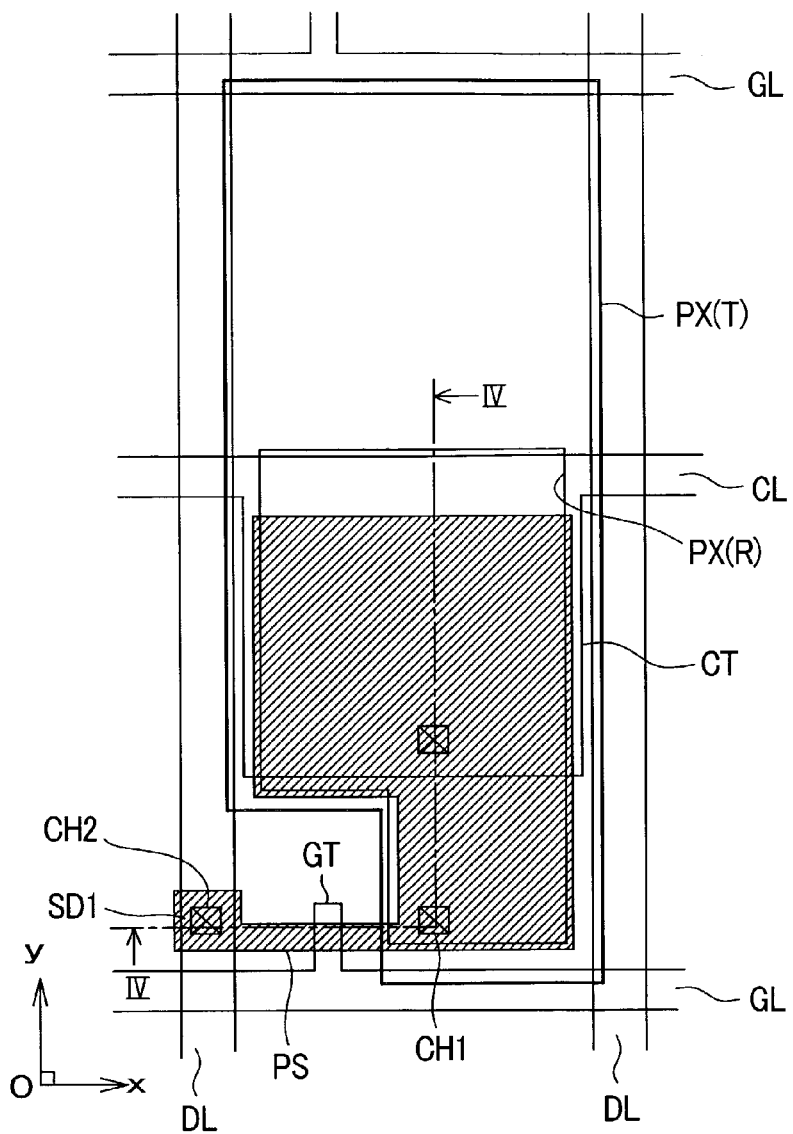
FIG. 3 is a plan view showing one embodiment of a pixel of the liquid crystal display device according to the invention.
Figure 4:
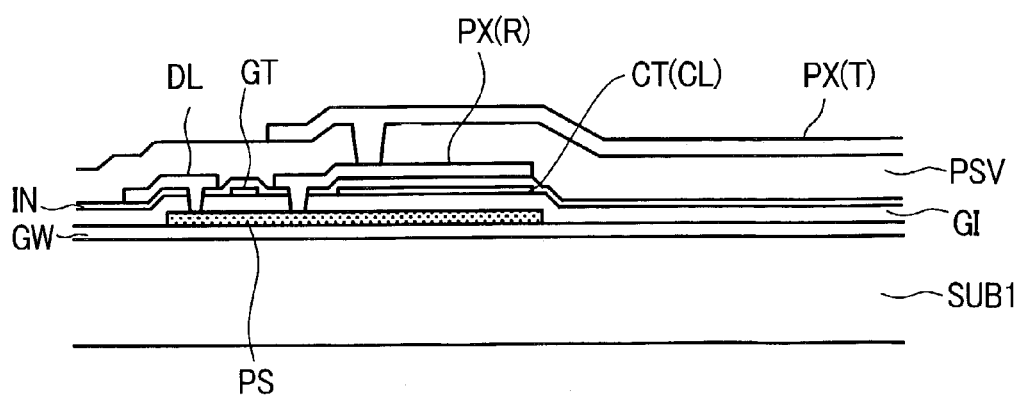
FIG. 4 is a cross-sectional view taken along line IV—IV of FIG. 3.

FIG. 3 is a plan view showing one embodiment of the above-described pixel area, and FIG. 4 is a cross-sectional view taken along line IV—IV of FIG. 3.

It is to noted that this pixel area is divided into, for example, two areas by an imaginary line running through the pixel area in the x direction and as viewed in FIG. 3, the upper and lower ones of the areas are respectively formed as an optically transmissive area and an optically reflective area to constitute a liquid crystal display device which can selectively use a so-called optically transmitting mode and optically reflecting mode.

Referring to FIGS. 3 and 4, a base layer GW made of SiO or SiN is formed on the liquid-crystal-side surface of the transparent substrate SUB1. This base layer GW is formed to prevent ionic impurities contained in the transparent substrate SUB1 from affecting the thin film transistor TFT which will be described later.

A semiconductor layer PS made of, for example, a polysilicon layer is formed on a surface of the base layer GW. This semiconductor layer PS is formed, for example, by depositing an amorphous Si film with a plasma CVD device and polycrystallizing the deposited amorphous Si film with an excimer laser.

This semiconductor layer PS is formed of a strip-shaped portion and an approximately rectangular portion. The strip-shaped portion is formed adjacently to the gate signal lines GL which will be described later, and the approximately rectangular portion is formed integrally with the strip-shaped portion to occupy approximately half of the pixel area (the lower side of FIG. 3).

The strip-shaped portion of the semiconductor layer PS is formed as the semiconductor layer of the thin film transistor TFT which will be described later, and the approximately rectangular portion of the semiconductor layer PS is formed as one of the electrodes of the capacitance element Cstg which will be described later.

A first insulating film GI made of, for example, $SiO_2$ or SiN is formed to cover the semiconductor layer PS on the surface of the transparent substrate SUB1 on which the semiconductor layer PS is formed in the above-described manner.

This first insulating film GI functions as a gate insulating film for the thin film transistor TFT as well as one of the dielectric films of the capacitance element Cstg which will be described later.

The gate signal lines GL which are extended in the x direction and to be juxtaposed in the y direction as viewed in FIG. 3 are formed on the upper surface of the first insulating film GI, and the gate signal lines GL define the rectangular pixel area together with the drain signal lines DL which will be described later.

Incidentally, these gate signal lines GL may be made of a conductive film having heat resistance, and may selectively use, for example, Al, Cr, Ta and TiW. In this embodiment, for example, TiW is used for the gate signal lines GL.

A part of the gate signal line GL (shown in the lower part of FIG. 3) is extended into the pixel area, and overlaps the strip-shaped semiconductor layer AS in such a manner as to intersect the same. The extended part of the gate signal line GL is formed as a gate electrode GT of the thin film transistor TFT.

Incidentally, after the gate signal line GL has been formed, an impurity is ion-implanted via the first insulating film GI so that the semiconductor layer PS is made electrically conductive except the area immediately below the gate electrode GT, whereby the source region and the drain region of the thin film transistor TFT are formed and one of the electrodes of the capacitance element Cstg is formed.

A capacitance signal line CL which is extended in the x direction as viewed in FIG. 3 is formed on the first insulating film GI in the middle of the pixel area. This capacitance signal line CL is formed integrally with the counter electrode CT which is extended into the lower area of the pixel area as viewed in FIG. 3. This capacitance signal line CL (the counter electrode CT) is formed in the same layer as and of the same material as, for example, the gate signal line GL.

A second insulating film IN made of, for example, $SiO_2$ or SiN is formed to cover the gate signal lines GL and the capacitance signal lines CL (the counter electrodes CT) on the upper surface of the first insulating film GI.

A pixel electrode PX(R) made of, for example, aluminum (Al) is formed on the upper surface of the second insulating film IN to occupy an approximately half area (the lower area as viewed in FIG. 3) of the pixel area. This pixel electrode PX(R) also serves as a reflecting film, and an optically reflective part is formed in the area in which the pixel electrode PX(R) is formed.

The portion of the pixel electrode PX(R) that is close to the thin film transistor TFT is connected to the semiconductor layer PS through a contact hole CH1 formed in the second insulating film IN and the first insulating film GI.

The region of the semiconductor layer PS that is connected to the pixel electrode PX(R) constitutes the source region of the thin film transistor TFT, while the drain region of the thin film transistor TFT is formed in the region of the semiconductor layer PS that lies on the opposite side across the portion of the semiconductor layer PS that overlaps the gate electrode GT, and is, in that region, connected to the drain signal line DL which will be described later, through a contact hole CH2.

In addition, the pixel electrode PX(R) is extended to approximately the middle of the pixel area in such a manner as to overlap the counter electrode CT, and constitutes one of the electrodes of the capacitance element Cstg.

In this manner, the capacitance element Cstg is formed as a capacitance element having a two-stage construction in which a first capacitance element and a second capacitance element are connected in parallel. The first capacitance element uses the counter electrode CT as one electrode, the approximately rectangular semiconductor layer AS as the other electrode, and the first insulating film GI as a dielectric film. The second capacitance element uses the counter electrode CT as one electrode, the pixel electrode PX(R) as the other electrode, and the second insulating film IN as a dielectric film.

The drain signal lines DL which are extended in the y direction and to be juxtaposed in the x direction as viewed in FIG. 3 are formed on the upper surface of the second insulating film IN. These drain signal lines DL define the pixel area together with the gate signal lines GL described above.

The drain signal lines DL are made of, for example, aluminum, aluminum overlying a base layer of TiW, or aluminum overlying a base layer of MoSi. There is a case where aluminum in direct contact with a polysilicon layer causes defective conduction at process temperatures not lower than, for example, 400° C., but the formation of such a base layer is effective on that case.

A part of the drain signal line DL is connected to the drain region (the side of the thin film transistor TFT that is connected to the drain signal line DL is herein defined as the drain region) of the thin film transistor TFT through the contact hole CH2 formed in the second insulating film IN and the first insulating film GI.

A third insulating film PSV is formed to cover the drain signal line DL and the pixel electrode PX(R) on the upper surface of the second insulating film IN. This third insulating film PSV is formed of, for example, $SiO_2$ or SiN. Instead, an organic film may also be formed by coating or the like. In the case of the organic film formed by coating or the like, its surface can be leveled to bring the alignment of the liquid crystal into a uniform state.

A pixel electrode PX(T) made of an optically transmissive material such as ITO (Indium-Tin-Oxide) film is formed on the upper surface of the third insulating film PSV. This pixel electrode PX(T) is formed to extend into the upper portion of the pixel area. An approximately half area of the pixel area excluding the optically reflective area is formed as the optically transmissive area by this pixel electrode PX(T).

The portion of the pixel electrode PX(T) that is adjacent to the thin film transistor TFT is connected to the pixel electrode PX(R) through a contact hole CH3 formed in the third insulating film PSV.

In this manner, the pixel electrode PX(T) is connected to the source region of the thin film transistor TFT via the pixel electrode PX(R), and when the thin film transistor TFT is turned on, a video signal from the drain signal line DL is supplied via the thin film transistor TFT to the pixel electrode PX(R) as well as the pixel electrode PX(T).

Incidentally, the pixel electrodes PX(R) and PX(T) are arranged to generate an electric field between the pixel electrodes PX(R) and PX(T) and the optically transmissive counter electrode which is formed in common to the juxtaposed pixel areas on the liquid-crystal-side surface of the transparent substrate SUB2 which is disposed in opposition to the transparent substrate SUB1 on which the pixel electrodes PX(R) and PX(T) are formed, with the liquid crystal interposed the transparent substrates SUB1 and SUB2, whereby the optical transmissivity of the liquid crystal is controlled by the electric field.

<<Thin Film Transistor>>

Figure 1:
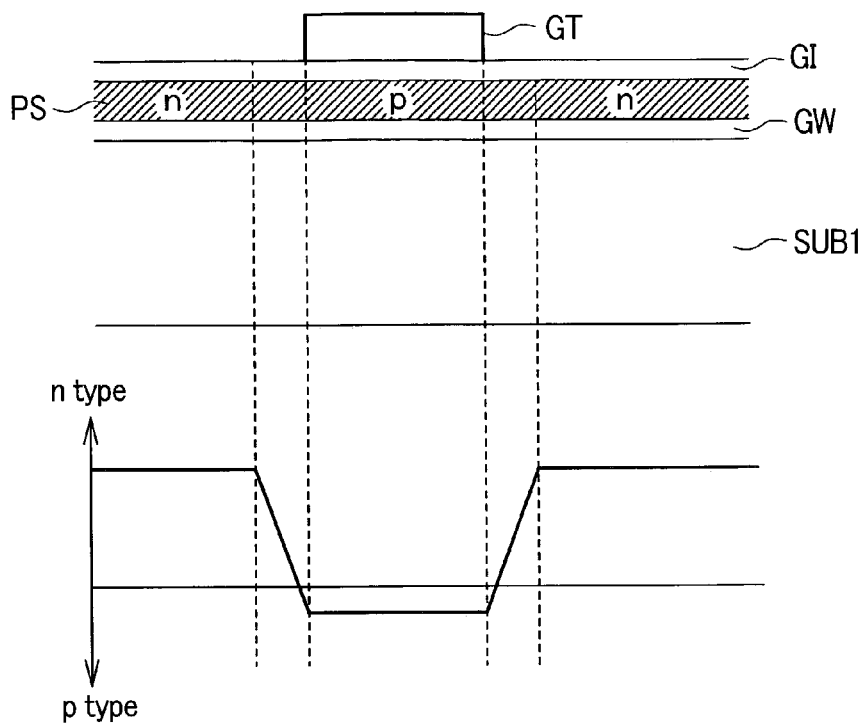
FIG. 1 is an explanatory view of the impurity distribution of a polycrystalline semiconductor layer, showing one embodiment of a thin film transistor according to the invention.

FIG. 1 is an explanatory view showing in detail the impurity concentration of the semiconductor layer PS made of, for example, a polycrystalline Si layer in the vicinity of the gate electrode GT of the thin film transistor TFT.

As is apparent from FIG. 1, the portion of the semiconductor layer PS immediately below the gate electrode GT is formed as a region of P conductivity type, and extends into the N conductivity type of drain region in such a manner that an impurity of P-type concentration is approximately linearly thinner, that is to say, an impurity of N-type concentration is approximately linearly thicker, from the region of P conductivity type toward the drain region.

Similarly, the portion of the semiconductor layer PS immediately below the gate electrode GT extends into the N conductivity type of source region in such a manner that the impurity of P-type concentration is approximately linearly thinner, that is to say, the impurity of N-type concentration is approximately linearly thicker, from the region of P conductivity type toward the source region.

Specifically, first of all, an activated N-type impurity made of, for example, phosphorus (P) is added to the entire area of the semiconductor layer PS. After that, an activated P-type impurity made of, for example, boron (B) is added to the area of the semiconductor layer PS that lies immediately below the gate electrode GT, and in each of LDD regions which respectively extend to the drain region and the source region from immediately below the gate electrode GT, the activated P-type impurity is distributed to become gradually lower in concentration from immediately below the gate electrode GT toward the drain region and the source region.

Incidentally, in the description of the embodiment, reference has been made to an example in which transistors each having a polycrystalline semiconductor layer according to the invention are used as switching elements in the respective pixels of a display area. However, it is possible to manufacture an image display device by using transistors each having a polycrystalline semiconductor layer according to the invention as switching elements in a circuit disposed in a driver circuit area (for example, a scanning driver circuit or a video signal circuit, or other circuits which can be formed on a substrate).

<<Manufacturing Method>>

FIGS. 5A to 5G are a process diagram showing one embodiment of a manufacturing method of the above-described thin film transistor. The manufacturing method will be described below step by step.

Step 1

An semiconductor layer AS made of an amorphous Si layer is formed on the upper surface of a transparent substrate SUB1, for example by a CVD method. It is appropriate that the film thickness of this semiconductor layer AS be, for example, about 50 nm.

Figure 5A:
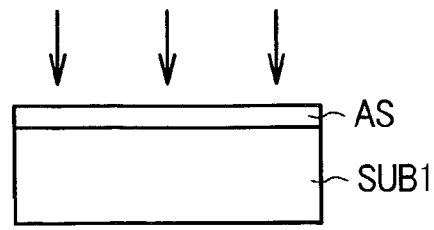
FIG. 5 is a process diagram showing one embodiment of a manufacturing method of a thin film transistor according to the invention.

Phosphorus (P) which is an N-type impurity is ion-implanted through the surface of the semiconductor layer AS under the conditions of, for example, 15 keV and 1×1015 $cm^2$ (FIG. 5A).

In this step, the ion-implanted N-type ions are added in a quantity not smaller than a so-called critical addition quantity (for example, in the case of phosphorus, $6 \times 1014$ $cm^{-2}$) in order to increase carrier density to realize good ohmic contact.

Step 2

Figure 5B:

The semiconductor layer AS is irradiated with, for example, an excimer laser, thereby polycrystallizing the semiconductor layer AS to form a semiconductor layer PS made of $N^+$-type polysilicon (FIG. 5B).

In this step, a laser beam is made to scan the entire area of the semiconductor layer AS while the semiconductor layer AS is being locally irradiated with the laser beam. Although the irradiation spot of the laser beam rises to a temperature as high as about 1,000° C., the irradiation spot is prevented from having a thermal adverse affect on the transparent substrate SUB1, by scanning the irradiation spot.

In this step, although phosphorus ions themselves are difficult to activate, the activation of phosphorus ions can be easily achieved by high-temperature processing using the laser beam.

Step 3

Figure 5C:
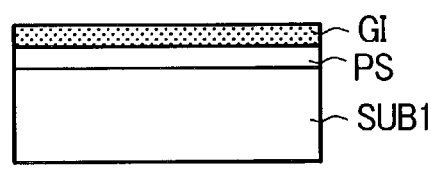

An insulating film GI made of, for example, an $SiO_2$ layer is formed to cover the semiconductor layer PS on the surface of the transparent substrate SUB1, for example by a CVD method. It is appropriate that the film thickness of this insulating film GI be, for example, about 100 nm (FIG. 5C).

Step 4

A photoresist film RE is formed on the surface of the transparent substrate SUB1, and the photoresist film RE which is formed in areas corresponding to the drain region and the source region of the semiconductor layer PS is left by a photolithography technique.

Figure 5D:
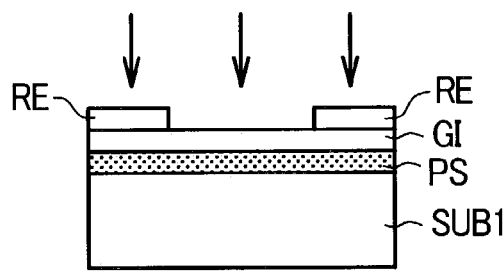

Then, the remaining photoresist film RE is used as a mask to ion-implant boron (B) as P-type ions through the surface of the mask under the conditions of, for example, 30 keV and $1\times10^{15}$ cm$^2$ (FIG. 5D).

In this step, it is preferable that the ion-implanted P-type ions be added in a quantity not smaller than a so-called critical addition quantity (for example, in the case of boron, $2\times10^{16}$ cm$^{-2}$) in view of the fact that the temperature of annealing in a later step (Step 6) is low.

Step 5

Figure 5E:
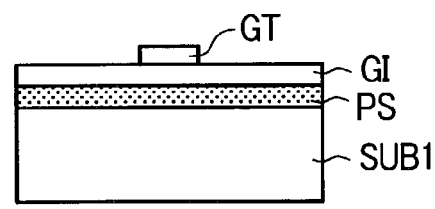

The photoresist film RE is removed, and a metal layer made of, for example, MoW is formed to cover the semiconductor layer PS on the surface of the transparent substrate SUB1. After that, a gate electrode is formed by, for example, spattering the metal layer (FIG. 5E).

Step 6

Activation of boron (B) in the semiconductor layer PS is carried out with RTA (Rapid Thermal Annealing) using, for example, a short-wavelength arc lamp.

In this case, the gate electrode is heated by the light of the short-wavelength arc lamp, and boron (B) ions immediately below the gate electrode are completely activated by the heating thereof and compensate for N-type polysilicon in that portion, whereby a P-type region is formed.

Figure 5F:
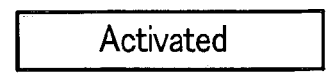

In addition, the temperature of RTA becomes lower toward the drain region or the source region from the region in which the gate electrode is formed, and the efficiency of activation decreases accordingly. Therefore, an N-type polysilicon layer having a concentration gradient can be formed in self-alignment (FIG. 5F).

In this step, it can be seen that the activation of boron ions is highly efficient owing to the heating of the gate electrode GT as compared with the case of, for example, phosphorus ions. This is because boron ions themselves are easy to activate compared to phosphorus ions.

Accordingly, concentration control on the LDD regions also becomes very easy.

Step 7

Figure 5G:
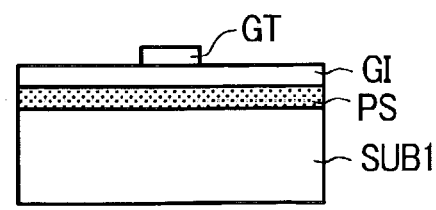

The distribution of impurity concentration immediately below and in the vicinity of the gate electrode GT of the semiconductor layer PS is formed as shown in FIG. 1 (FIG. 5G).

In the above description of the embodiment, reference has been made to the thin film transistor TFT formed in each of the pixel areas. However, as described previously, each of the MIS transistors which constitute the scanning driver circuit V and the video signal driver circuit He also has the semiconductor layer formed of a polycrystalline semiconductor layer such as a polycrystalline Si layer, and therefore, it goes without saying that the invention can also be applied to the MIS transistors.

In the above description of the embodiment, reference has been made to the polycrystalline thin film transistors TFT formed in the liquid crystal display device. However, it goes without saying that the invention can also be applied to polycrystalline thin film transistors to be formed in, for example, an EL (Electro Luminescence) type of image display device or other devices.

As is apparent from the foregoing description, according to the invention, it is possible to provide an image display device of superior display characteristics which has thin film transistors each having fully activated drain and source regions, as well as a manufacturing method of such image display device. In addition, according to the invention, it is possible to provide an image display device whose manufacturing yield is good because of its construction which makes impurity concentrations easy to control in the LDD regions of each polycrystalline thin film transistor.

The invention claimed is:

1. An image display device using transistors each having a polycrystalline semiconductor layer, comprising:
    a gate electrode formed on an upper surface of the polycrystalline semiconductor layer with an insulating film interposed therebetween, a drain region being formed in the polycrystalline semiconductor layer on one side of the gate electrode, and a source region being formed in the polycrystalline semiconductor layer on another side of the gate electrode;
    an activated P-type impurity added to the polycrystalline semiconductor layer in an area underlying the gate electrode; and
    an activated N-type impurity added to the polycrystalline semiconductor layer in an area excluding the area underlying the gate electrode, wherein the polycrystalline semiconductor layer has areas which respectively extend from the area underlying the gate electrode to the drain region and the source region and in which the activated P-type impurity is distributed to gradually decrease from the area underlying the gate electrode toward the drain region and the source region, respectively.

2. An image display device according to claim 1, wherein the polycrystalline semiconductor layer to which the activated N-type impurity is added is formed by doping an amorphous semiconductor with an N-type impurity and annealing the amorphous semiconductor by irradiation with laser light.

3. An image display device according to claim 1, wherein the transistors each having the polycrystalline semiconductor layer are respectively used as switching elements in pixels of a display area in the liquid crystal display device.

4. An image display device according to claim 1, wherein the transistors each having the polycrystalline semiconductor layer are used in a scanning driver circuit and a video signal driver circuit in the liquid crystal display device.

5. An image display device using transistors each having a polycrystalline Si layer, comprising:
    a gate electrode formed on an upper surface of the polycrystalline Si layer with an insulating film interposed therebetween, a drain region being formed in the polycrystalline Si layer on one side of the gate electrode, and a source region being formed in the polycrystalline Si layer on another side of the gate electrode;
    activated boron added to the polycrystalline Si layer in an area underlying the gate electrode; and
    activated phosphorus added to the polycrystalline Si layer in an area excluding the area underlying the gate electrode,
    the polycrystalline Si layer having areas which respectively extend from the area underlying the gate electrode to the drain region and the source region and in which the activated boron is distributed to gradually decrease from the area underlying the gate electrode toward the drain region and the source region, respectively.

6. An image display device according to claim 5, wherein the polycrystalline Si layer is formed by doping an amorphous Si layer with phosphorus and annealing the amorphous Si layer by irradiation with laser light.

* * * * *